United States Patent
Bhat et al.

(10) Patent No.: US 6,455,878 B1
(45) Date of Patent: Sep. 24, 2002

(54) SEMICONDUCTOR LED FLIP-CHIP HAVING LOW REFRACTIVE INDEX UNDERFILL

(75) Inventors: Jerome Chandra Bhat, San Francisco; Michael Joseph Ludowise, San Jose; Daniel Alexander Steigerwald, Cupertino, all of CA (US)

(73) Assignee: LumiLeds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 09/858,833

(22) Filed: May 15, 2001

(51) Int. Cl.$^7$ ............................ H01L 33/00; H01L 23/48
(52) U.S. Cl. ..................... 257/99; 257/103; 257/668; 257/693; 257/201
(58) Field of Search ................... 257/96, 190, 200, 257/183, 103, 104, 676, 668, 701, 693; 438/32, 47, 108, 118

(56) References Cited

U.S. PATENT DOCUMENTS

| | | | |
|---|---|---|---|
| 5,448,114 A | | 9/1995 | Kondoh et al. ............. 257/778 |
| 5,585,648 A | * | 12/1996 | Tischler ..................... 257/103 |
| 5,625,202 A | * | 4/1997 | Chai ......................... 257/103 |
| 5,661,074 A | * | 8/1997 | Tischler ..................... 117/90 |
| 5,679,965 A | * | 10/1997 | Schetzina ................... 257/103 |
| 5,739,554 A | * | 4/1998 | Edmond et al. ............ 257/103 |
| 6,015,722 A | * | 1/2000 | Banks et al. ................ 438/108 |
| 6,046,464 A | * | 4/2000 | Schetzina ................... 257/190 |
| 6,175,151 B1 | * | 1/2001 | Hashimoto .................. 257/668 |
| 2001/0004188 A1 | * | 6/2001 | Jacobsen et al. ............ 313/461 |

OTHER PUBLICATIONS

Baliga, John, Technology News, Assembly & Packaging, "Low–Cost MEMS Packaging Includes Protective Cavities," Semiconductor International, Feb. 2001, p. 56.

* cited by examiner

*Primary Examiner*—Michael S. Lebentritt
(74) *Attorney, Agent, or Firm*—Skjerven Morrill LLP

(57) ABSTRACT

In accordance with the invention, a difference in index of refraction is created at the mesa wall of a III-nitride flip chip light emitting device. The step in index of refraction reflects much of the light incident on the mesa wall back into the device where it can be usefully extracted. In some embodiments, a solder wall on the submount or a high index gel coating the light emitting device and the submount creates a sealed gap between the light emitting device and the submount. The gap is filled with a material having a low index of refraction. In other embodiments, a high index material covers the substrate of the light emitting device, and a low index material fills the gap between the submount and the light emitting device.

24 Claims, 4 Drawing Sheets

SEMICONDUCTOR LED FLIP-CHIP HAVING LOW REFRACTIVE INDEX UNDERFILL

BACKGROUND

Semiconductor light-emitting diodes (LEDs) are among the most efficient light sources currently available. Materials systems currently of interest in the manufacture of high-brightness LEDs capable of operation across the visible spectrum include Group Ill-V semiconductors, particularly binary, ternary, and quaternary alloys of gallium, aluminum, indium, and nitrogen, also referred to as III-nitride materials. Typically, III-nitride devices are epitaxially grown on sapphire, silicon carbide, or III-nitride substrates by metal-organic chemical vapor deposition (MOCVD), molecular beam epitaxy (MBE), or other epitaxial techniques. Some of these substrates are insulating or poorly conducting. Devices fabricated from semiconductor crystals grown on such substrates must have both the positive and the negative polarity electrical contacts to the epitaxially-grown semiconductor on the same side of the device. In contrast, semiconductor devices grown on conducting substrates can be fabricated such that one electrical contact is formed on the epitaxially grown material and the other electrical contact is formed on the substrate. However, devices fabricated on conducting substrates may also be designed to have both contacts on the same side of the device on which the epitaxial material is grown in a flip-chip geometry so as to improve light extraction from LED chip, to improve the current-carrying capacity of the chip, or to improve the heat-sinking of the LED die.

In order to fabricate efficient LED devices, the contacts must be electrically isolated from each other such that electrical carriers of the appropriate polarity are injected into the p-type and n-type sides of the semiconductor junction, where they recombine to produce light. FIG. 1 illustrates a typical III-nitride LED device. Semiconductor layers, including, for example, n-layer 12, active region 13, and p-layer 14 are epitaxially grown on substrate 11. P-contact 15 and n-contact 17 are formed on the same side of the device as described above. Electrical isolation between the p-contact 15 and the n-contact 17 is achieved by etching a mesa structure 18 into the device extending from the topmost layer down into the underlying n-layer and forming separate, defined p-contact 15 and n-contact 17. The LED is mounted to a submount assembly 22, which typically includes a submount on which the LED is mounted with solder bumps. The solder bumps create a gap between the submount and the LED. The connected LED and submount assembly are then typically encapsulated in a high index of refraction gel or epoxy.

The high index gel or epoxy is selected to match the index of refraction of the sapphire substrate as closely as possible, since the light produced in the device is extracted through the sapphire substrate. When light is incident on an interface between two materials, the difference in index of refraction determines how much light is reflected at that interface, and how much light is transmitted through it. The larger the difference in index of refraction, the more light is reflected. Thus, the small difference between the index of refraction of the sapphire substrate and the high index gel encapsulating the device ensures that most of the light generated in the device that reaches the emitting surfaces of the sapphire substrate is extracted from the device.

Photons are generated efficiently within active region 13, but extracting the photons from the semiconductor into the LED package and to the outside world is difficult, in part due to the high indices of refraction of the semiconductor layers. See, for example, Windisch et al., Applied Physics Letters, vol. 74, no. 16, p2256 (1999). Photons generated within the epitaxial semiconductor are incident upon either the interface between the semiconductor and substrate 11, the interface at mesa wall 18 between the semiconductor and the high index gel in submount assembly 22, or the interface between the semiconductor and the metal contacts. Photons incident on any of the three interfaces face a step in material refractive index. Such a step in refractive index causes a ray 20 incident on such an interface to be split into a transmitted portion 20a and a reflected portion 20b. Light transmitted out from mesa wall 18 (i.e. portion 20a) cannot be directed out of the device in a useful direction, thus light lost through transmission at mesa wall 18 contributes to the low light extraction efficiency of semiconductor LEDs.

The high index gel encapsulating the device results in a small difference in refractive index at the interface at mesa wall 18 between the semiconductor area between the contacts and the submount assembly. As a result, much of the light incident on this area is transmitted in the direction of the submount assembly, which causes significant optical loss. As described above, light extracted in this area towards the submount assembly cannot be usefully extracted from the package; rather, it is incident on the submount where it is absorbed. The device area between the contacts on a device such as that shown in FIG. 1 is estimated at 10% of the total area. This area includes the mesa wall and a small portion of semiconductor material parallel to the substrate and between the edge of each contact and the mesa wall. Methods of reducing such losses include the use of wafer fabrication techniques such as self-aligned metalization and tightened manufacturing tolerances to reduce the area between the contacts parallel to the substrate. Such wafer fabrication techniques may result in other problems such as increased reliability problems and difficulty in manufacturing. In addition, wafer fabrication techniques do not significantly reduce losses, since 3-D optical ray trace modeling of high index gel-encapsulated, III-nitride LED structures grown on sapphire shows that, of the light undesirably extracted from the LED chip in this direction, the majority is lost through the mesa wall rather than from any surface of the epitaxial material which runs parallel to the substrate surface on which the epitaxial semiconductor was grown. The light extracted at the mesa wall is on the order of 15% of the light generated within the LED, the exact figure depending on, among other factors, the mesa wall height and angle.

Accordingly, an LED structure that minimizes optical loss at the mesa wall is needed.

SUMMARY

In accordance with the invention, a step in index of refraction is created at the mesa wall of a III-nitride flip chip light emitting device. The step in index of refraction reflects much of the light incident on the mesa wall back into the device where it can be usefully extracted. In some embodiments, a solder wall on the submount or a high index gel or epoxy coating the light emitting device and the submount creates a sealed gap between the light emitting device and the submount. The gap is filled with a material having a low index of refraction, such as air, another low index gas, low index flux, or a low index silicone gel or epoxy. In other embodiments, a high index material covers the substrate of the light emitting device, and a low index material fills the gap between the submount and the light emitting device. The high index material may be a silicone gel, epoxy, or a solid high index block, and the low index material may be a different silicone gel, epoxy, or a low index gas such as air.

DETAILED DESCRIPTION

In accordance with the invention, a large step in refractive index is created at the mesa wall separating the p-contact and the n-contact. The step in index of refraction is created by placing a material having a low index of refraction at the mesa wall. As used herein, "high" index of refraction refers to an index of refraction greater than or equal to the index of refraction of a material index-matched to sapphire. Sapphire has an index of refraction of about 1.7 to 1.8, and materials having indices of refraction as low as 1.5 are considered index-matched to sapphire. In contrast, "low" index of refraction refers to an index of refraction less than a high index of refraction, e.g. less than about 1.5.

The large step in refractive index maximizes the light reflected at the mesa wall and minimizes the light transmitted through the mesa wall. The light reflected at the mesa wall can then be usefully extracted through the substrate. Any light transmitted at the mesa wall is typically lost. In addition to creating a large step in refractive index at the mesa wall, the size and shape of the mesa wall are selected to maximize light reflection and minimize light transmission.

Figure 1:
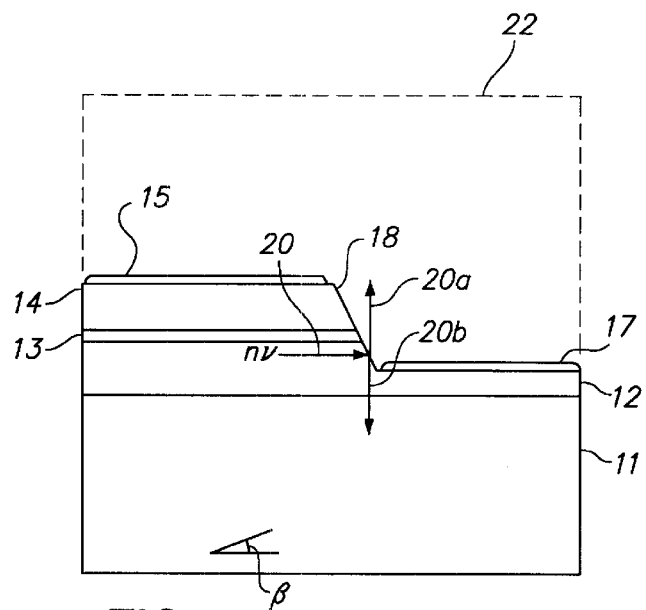
FIG. 1 illustrates a flip-chip light emitting diode.
Figure 2:
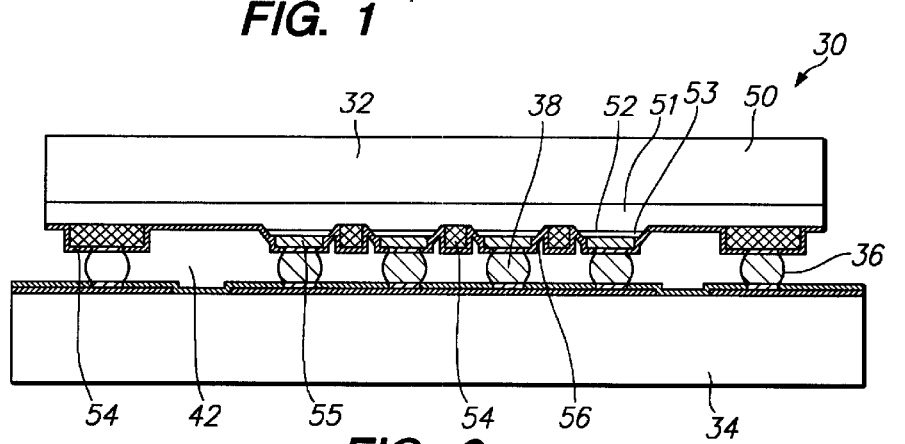
FIG. 2 illustrates an LED mounted on a submount.

FIG. 2 illustrates a first embodiment of the invention. An LED flip chip 32 is mounted epitaxial-layers-down on a submount 34. An n-type layer 51 is deposited on a substrate 50. An active region 52 is then formed on n-type layer 51, and a p-type layer 53 is formed on the active region. A portion of p-type layer 53, active region 52, and n-type layer 51 are etched away to expose a portion of n-type layer 51. The etch leaves mesa wall 56, which allows a p-contact 55 to be connected to p-type layer 53 electrically isolated from n-type layer 51. An n-contact 54 connects to the n-layer.

Figure 3:
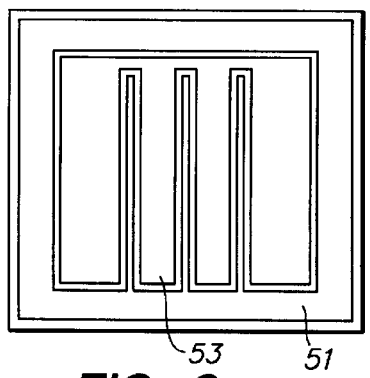
FIG. 3 is a plan view of an LED showing the location of the p-layer and the n-layer.
Figure 4:
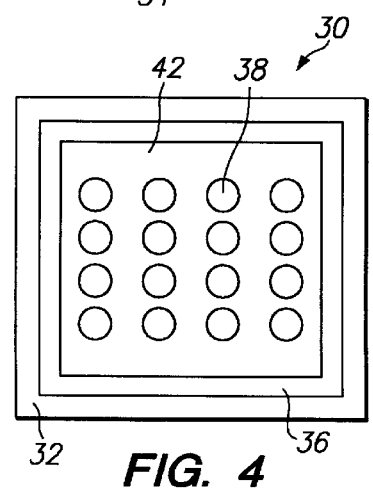
FIG. 4 is a plan view of a submount showing the location of solder bumps and a solder wall.

FIG. 3 illustrates a plan view of the device illustrated in FIG. 2. The n-layer 51 encloses p-layer 53. Both p-layer 53 and n-layer 51 include projections which interpose portions of the opposing polarity layer. Returning to FIG. 2, LED 32 is connected to the submount by solder bumps 38, which connect to p-contact 55, and a solder wall 36 which connects to n-contact 54. FIG. 4 illustrates the location of solder bumps 38 and solder wall 36 on a submount.

When the submount illustrated in FIG. 4 is soldered to the LED illustrated in FIG. 3, thick solder bumps 38 and solder wall 36 cause a gap 42 to be formed between the LED and the submount. In the first embodiment of the invention, air, nitrogen, a noble gas, forming gas, hydrogen, or another gas with a low index of refraction is trapped in gap 42 between the LED and the submount when the LED is mounted on the submount. Forming gas is a mixture of hydrogen and nitrogen often used as a soldering atmosphere. Gasses having high thermal conductivities, such as hydrogen and helium, may specifically be chosen so as to improve thermal transfer between the LED die and the submount, thereby improving the heat-sinking of the LED chip. Solder wall 36 encloses gap 42 and prevents the air or other low index gas from escaping. The gas fills the space in gap 42, thus the gas is incident on mesa wall 56. The layers that make up mesa wall 56, i.e. n-layer 51, active layer 52, and p-layer 53 are all GaN-based materials, and therefore have an index of refraction of about 2.4. In contrast, the air or low index of refraction gas has an index of refraction of about 1. As a result of the large step in index of refraction at mesa wall 56, most light incident on mesa wall 56 will be reflected back into the LED towards substrate 32, where it can be extracted in a useful direction, rather than transmitted into gap 42, where it cannot be extracted in a useful direction.

After the LED is mounted on the submount, trapping air or a low index gas in gap 42, the device can then be encapsulated in a high index material, as described above. Solder wall 36 prevents any of the high index gel from contacting mesa wall 56.

Mesa wall 56 may also be coated with a dielectric layer such as alumina, silica, or silicon nitride. Such a structure has a similar result, so long as the dielectric coating is then incident on air or some other low index material.

In another embodiment of the invention, rather than a gas, a low index material such as a low index flux or a low index silicone gel or epoxy is trapped in gap 42. Flux is a material used in the process of soldering the LED to the submount. Solder bumps 38 and solder wall 36 may be, for example, an alloy of Pb and Sn. When exposed to air, an oxide forms on the surface of solder bumps 38 and solder wall 36. Flux is applied to dissolve the oxide formed on the solder. In this embodiment, a quantity of low index flux, low index silicone or other gel, or low index epoxy is trapped in gap 42, and prevented from escaping by solder wall 36. Solder wall 36 also prevents the high index material encapsulating the device from contaminating the low index material in gap 42.

Figure 5:
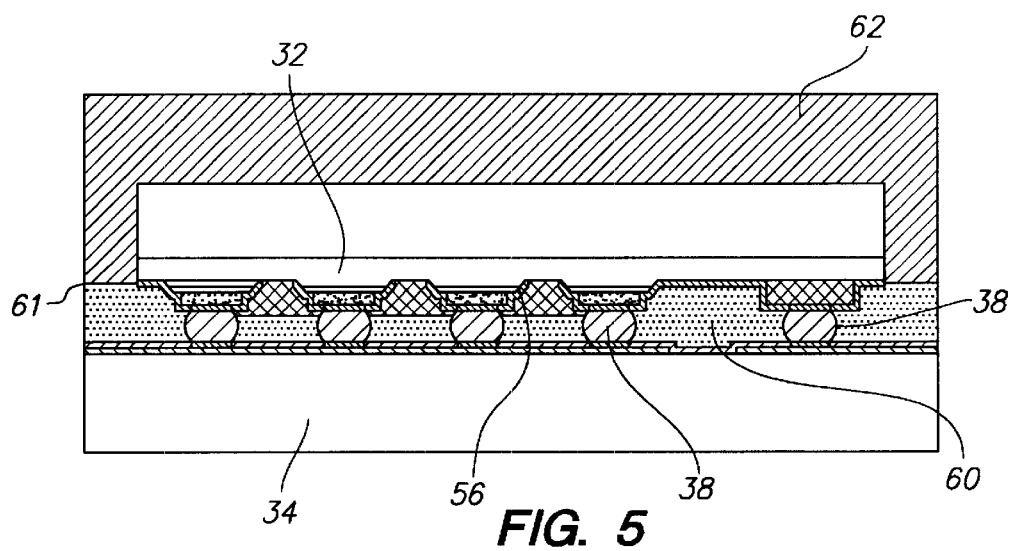
FIG. 5 illustrates an LED mounted on a submount and partially encapsulated in a low index material and partially encapsulated in a high index material.

FIG. 5 illustrates another embodiment of the present invention. In this embodiment, no solder wall 36 isolates mesa wall 56 from the outside of the device. The n-contacts are connected to the submount by solder bumps 38, similar to the solder bumps connecting the p-contacts to the submount. In this embodiment, the space between the submount and the LED, up to around the layer of epitaxial material adjacent to the substrate, is filled with a low index gel or low index epoxy 60. The low index gel or epoxy suppresses light extraction at the mesa wall towards the submount. The remainder of the device, i.e. the substrate, is encapsulated in a high index gel or high index epoxy 62, which maximizes light extraction from the substrate. The high index gel or epoxy 62 and low index gel or epoxy 60 are selected so that they are viscous enough not to mix at the interface 61 between the low index and high index gels or epoxies. Alternatively, the low-index gel or epoxy may be cured to a viscous or hardened state prior to application of the high-index gel or epoxy, thereby reducing the likelihood of intermixing of the low- and high-index materials at the interface between the two materials. In another embodiment, the entire device may be encapsulated in a single high index gel or epoxy, but the epitaxial side of LED is coated with a material which causes the high index gel or epoxy to react to form a low index material adjacent the lower, epitaxial side of the device.

Figure 6:
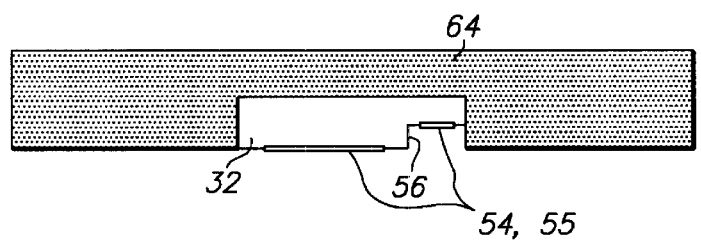
FIG. 6 illustrates an LED mounted in a high index block.

FIG. 6 illustrates another embodiment of the present invention. After being mounted on the submount, the LED 32 is attached to a high index block 64 of solid material. High index block 64 is index-matched to the substrate of LED 32, and thereby maximizes light extraction from the substrate. High index block 64 replaces the high index gel typically encapsulating the LED mounted on the submount. High index block 64 may be shaped so as to further enhance light extraction from the assembly. Since high index block 64 is solid, it does not contact mesa wall 56. LED 32 can therefore be mounted on a submount such that mesa wall 56 is incident on air, thus minimizing light extracted at mesa wall 56. High index block 64 may be, for example, oxides of aluminum, tungsten, hafnium, yttrium, and cerium; flourides of cerium, lanthanum, and neodium; high index glass; or zirconia if the LED is formed on a sapphire substrate. High index block 64 may be, for example, zinc sulfide, III-nitride materials, SiC, ZnSe and oxides of titanium, zirconium, manganese, chromium, niobium, indium, tin, tantalum, and antimony if the LED is formed on a SiC substrate. High index block 64 may be, for example, zinc sulfide, III-nitride materials, SiC, ZnSe and oxides of titanium, zirconium, manganese, chromium, niobium, indium, tin, tantalum, and antimony if the LED is formed on a III-nitride substrate.

Figure 7:
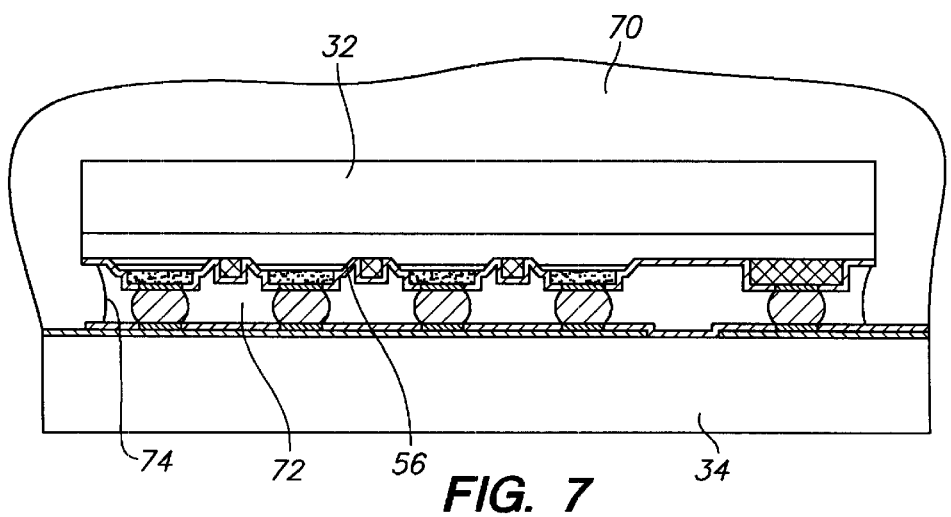
FIG. 7 illustrates an LED mounted on a submount and encapsulated in a high index, viscous material.

FIG. 7 illustrates another embodiment of the present invention, where the high index gel used to encapsulate the device is extremely viscous. In this embodiment, the high index material 70 is too viscous to fill the area between LED 32 and submount 34. The viscous high index material 70 forms wall 74 between LED 32 and submount 34, which traps a pocket 72 of air or another low index material between LED 32 and submount 34. As a result, mesa wall 56 is incident on a low index material, thus minimizing the extraction of light at the mesa wall.

Figure 8A:
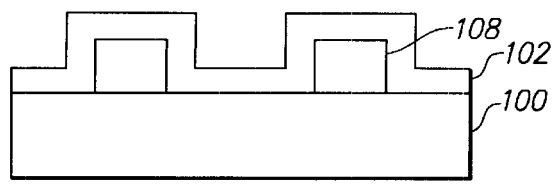
FIGS. 8A–8C illustrate an embodiment of the present invention.
Figure 8B:
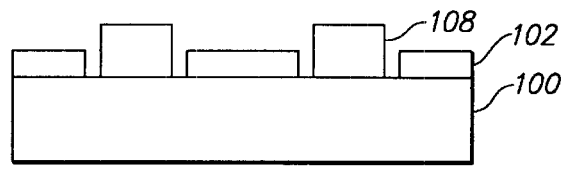
Figure 8C:
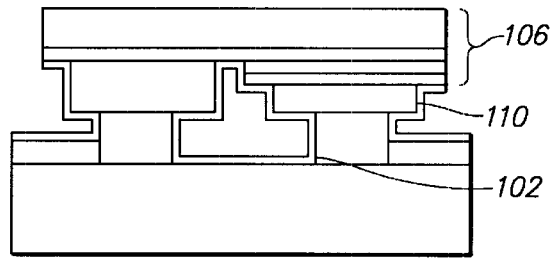

FIGS. 8A–8C illustrate still another embodiment of the present invention. A low index material is applied to the mesa wall using dry film technology. Such dry films are available with an index of refraction as low as 1.3. Photo-sensitized polypropylene or polyethylene form appropriate polymer dry-films. In order to form a light emitting structure with a polymer dry-film low index material on the mesa wall, first a photo-sensitive polymer dry-film 102 is vacuum-formed onto submount 100. Attached to the submount are solder bumps 108 which are used to attach the LED to the submount. The photo-sensitive polymer film 102 is then patterned to remove the film covering the solder bumps, as illustrated in FIG. 8B. The photo-sensitive polymer film may be patterned by, for example, applying a photomask over the film and exposing the photomask to dissolve away in a developer solution those portions of the film covering solder bumps 108. The film may also be patterned by laser ablation or by patterning the film using standard photoresist, solvents, and/or etchants.

The LED chip 106 is then located over solder bumps 108 and remaining island of dry-film polymer 102, as illustrated in FIG. 8C. The LED and submount are then heated to fuse the solder 108 to the soldering pads 110 of LED 106. In the process, the polymer dry-film 102 also softens and flows, contacting the LED surface and wetting to the mesa wall. The polymer dry-film 102 also wets to the submount wafer 100, forming an impervious layer joining the LED chip to the submount wafer and flowing around the solder connects.

The film is also chosen so as to serve as a solder mask so that closer spacing between the solder bumps may be obtained than is possible without polymer dry-film; the presence of the mask reduces the probability of solder bridging between adjacent solder bumps.

The structures described in FIGS. 2–8C may offer several advantages. Each structure creates a large step in index of refraction at the mesa wall, thus each structure improves useful light extraction in the device. In addition, the structures described above are simple and inexpensive to fabricate, and typically involve little or no additional semiconductor processing.

Figure 9:
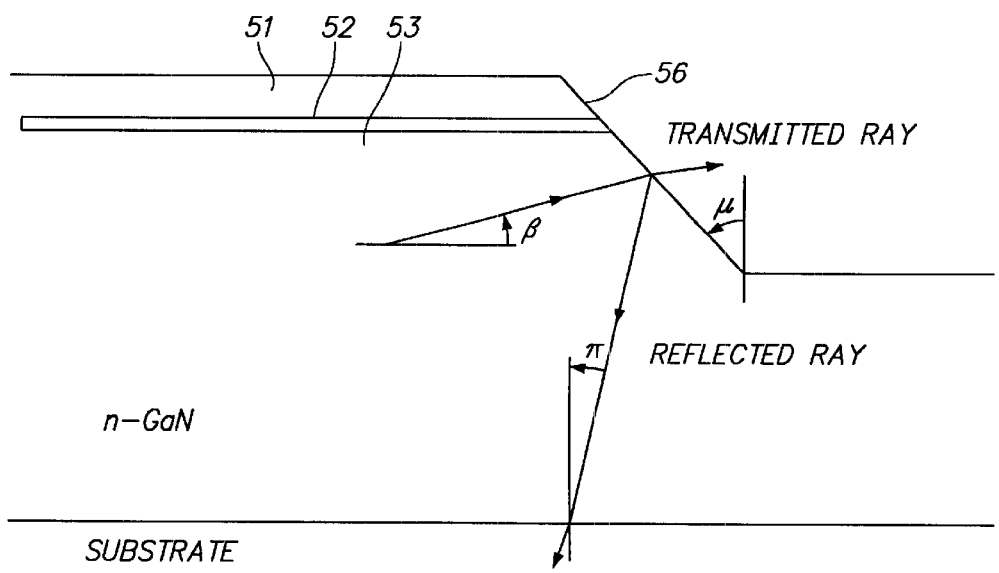
FIG. 9 illustrates an example of a mesa wall.

The size and shape of mesa wall 56 can be selected to maximize reflection of rays incident on the mesa wall. FIG. 9 illustrates the mesa in more detail. The inclination of the mesa wall, $\mu$, determines the angle of incidence of a reflected ray on the GaN-substrate interface. The angle of incidence is $\pi$. In order to maximize the probability of extraction of this ray, $\pi$ must be as small as possible, and smaller than the critical angle for total internal reflection at the GaN-substrate interface.

Figure 10:
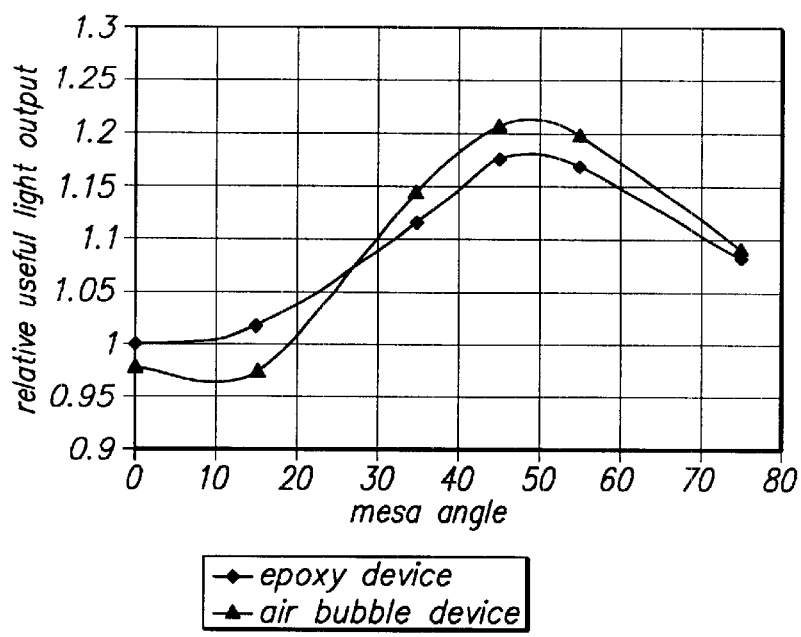
FIG. 10 illustrates useful light output as a function of mesa wall angle for different devices.

FIG. 10 illustrates the extracted light as a function of mesa wall angle for a device where the mesa wall is incident on a high index material, and for a device according to the present invention where the mesa wall is incident on air. FIG. 10 illustrates that considerable enhancement of useful light extraction from the chip can be achieved by selecting a structure having an optimal mesa wall angle. The optimal value of mesa wall angle is dependent on the exact device structure. The triangles illustrate a device with a mesa wall incident on air and the diamonds illustrate a device with a mesa wall incident on a high index epoxy. For a device with a mesa wall incident on air, a mesa wall angle between 35 and 65 degrees is optimal for useful light extraction from the chip, and the devices with the best useful light extraction have a mesa wall angle between 45 and 55 degrees. The mesa wall angle is controlled by tailoring the dry-etch process by which the mesa is defined. Alternatively, an appropriate crystallographic etch could also selectively etch a mesa wall with a particular angle.

Figure 11:
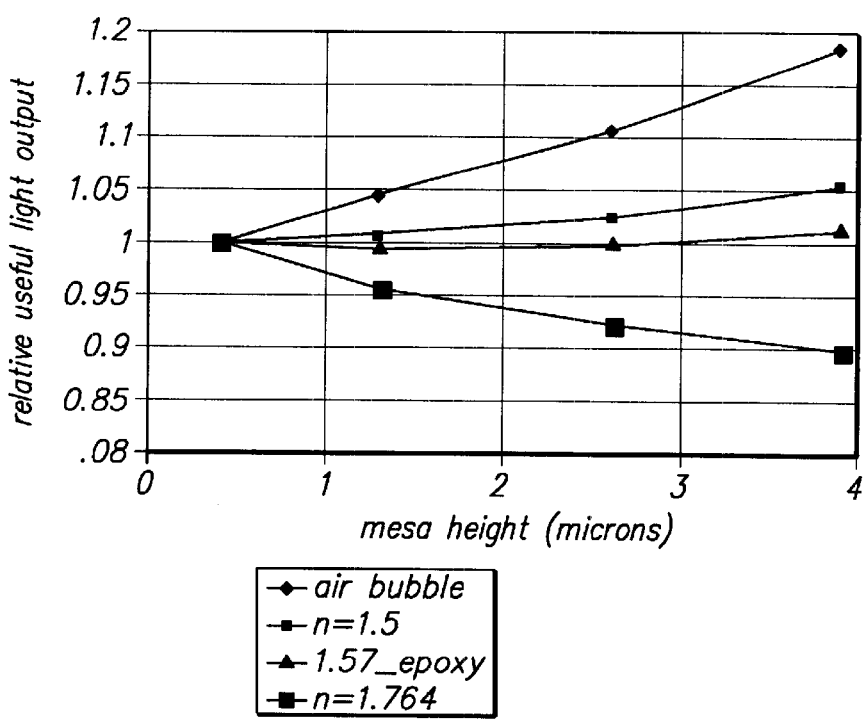
FIG. 11 illustrates useful light output as a function of mesa wall height for different devices.

The optimal height of the mesa wall is also dependent on the structure of the LED chip. FIG. 11 illustrates the useful light output as a function of mesa wall height for several devices. The diamonds illustrate a device with a mesa wall incident on air, the small squares illustrate a device with a mesa wall incident on a material with an index of refraction of 1.5, the triangles illustrate a device with a mesa wall incident on a material with an index of refraction of 1.57, and the large squares illustrate a device with a mesa wall incident on a material having an index of refraction of 1.764. For a chip having an optimally angled mesa wall incident on a low index material, a chip having a taller mesa has higher useful light extraction. This is because if the mesa wall is highly reflecting, light reflected from the mesa wall escapes the device quickly without attenuation. However, if the mesa wall is incident on a material having a high refractive index, illustrated by the squares, useful light extraction decreases as the mesa height is increased due to increased light extraction through the mesa wall. The mesa height is controlled by controlling the depth of the etch into the n-type GaN layer. After etching, enough n-type GaN must remain for formation of a reliable, low resistance n-contact.

While particular embodiments of the present invention have been shown and described, it will be obvious to those skilled in the art that changes and modifications may be made without departing from the invention in its broader aspects and, therefore, the appended claims are to encompass within their scope all such changes and modifications as fall within the true spirit and scope of this invention. For example, the invention is not limited to a GaN-based device as described above.

We claim:

1. A light emitting structure, comprising:
    a III-nitride light emitting device, the light emitting device comprising:
        a substrate;
        an n-type layer overlying the substrate;
        an active region overlying the n-type layer;
        a p-type layer overlying the active region;
        an n-contact connected to the n-type layer; and
        a p-contact connected to the p-type layer, wherein the n-contact and the p-contact are formed on the same side of the device and the n-contact is separated from the p-contact by a mesa wall;
    a submount, connected to the light emitting device;
    a gap between the III-nitride light emitting device and the submount; and
    a quantity of material in the gap, wherein the quantity of material is incident on the mesa wall and has a low index of refraction.

2. The light emitting structure of claim 1 wherein the gap between the III-nitride light emitting device and the submount is sealed by an outer solder wall disposed on the submount, and wherein the submount is connected to the III-nitride light emitting device by the outer solder wall.

3. The light emitting structure of claim 1 further comprising a gel deposited over a portion of the light emitting device and the submount, wherein the gap between the III-nitride light emitting device and the submount is sealed off by the gel.

4. The light emitting structure of claim 1 wherein the material is a gas.

5. The light emitting structure of claim 4 wherein the gas is selected from the group consisting of air, nitrogen, hydrogen, helium, neon, argon, krypton, and xenon.

6. The light emitting structure of claim 4 wherein the gas is a forming gas.

7. The light emitting structure of claim 1 wherein the material is a silicone gel.

8. The light emitting structure of claim 1 wherein the material is flux.

9. The light emitting structure of claim 1 wherein the light emitting device further comprises a dielectric layer formed over the mesa wall.

10. The light emitting structure of claim 1 wherein the material is epoxy.

11. The light emitting structure of claim 1 wherein the material has an index of refraction between about 1 and 1.5.

12. The light emitting structure of claim 1 wherein the material is an organic polymer.

13. The light emitting structure of claim 1 wherein the material is a polymer dry-film.

14. The light emitting structure of claim 1 wherein the mesa wall forms an angle with the substrate between 35 and 65 degrees.

15. The light emitting structure of claim 1 wherein the mesa wall forms an angle with the substrate between about 45 and 55 degrees.

16. The light emitting structure of claim 1 wherein the mesa wall has a height between about 1 and 4 $\mu$m.

17. A light emitting structure, comprising:
    a III-nitride light emitting device, the light emitting device comprising:
        a substrate;
        an n-type layer overlying the substrate;
        an active region overlying the n-type layer;
        a p-type layer overlying the active region;
        an n-contact connected to the n-type layer; and
        a p-contact connected to the p-type layer, wherein the n-contact and the p-contact are formed on the same side of the device and the n-contact is separated from the p-contact by a mesa wall;
    a submount connected to. the III-nitride light emitting device such that a gap is present between the submount and the III-nitride light emitting device;
    a first quantity of material having a first index of refraction, the first quantity of material covering the substrate of the III-nitride light emitting device; and
    a second quantity of material having a second index of refraction, the second quantity of material being disposed in the gap between the submount and the light emitting device and being incident on the mesa wall;
    wherein the first index of refraction is greater than the second index of refraction.

18. The light emitting structure of claim 17 wherein the first quantity of material is a first silicone gel and the second quantity of material is a second silicone gel.

19. The light emitting structure of claim 17 wherein the first quantity of material is a first epoxy and the second quantity of the material is a second epoxy.

20. The light emitting structure of claim 17 wherein the first quantity of material is one of a silicone gel and an epoxy and the second quantity of material is the other of a silicone gel and an epoxy.

21. The light emitting structure of claim 17 wherein the first quantity of material is a solid block of material and the second quantity of material is a gas.

22. The light emitting structure of claim 17 wherein the substrate is sapphire and the first quantity of material is selected from the group consisting of oxides of aluminum, oxides of tungsten, oxides of hafnium, oxides of yttrium, oxides of cerium, fluorides of cerium, fluorides of lanthanum, fluorides of neodium, high index glass, and zirconia.

23. The light emitting structure of claim 17 wherein the substrate is SiC and the first quantity of material is selected from the group consisting of zinc sulfide, III-nitride materials, SiC, ZnSe, oxides of titanium, oxides of zirconium, oxides of manganese, oxides of chromium, oxides of niobium, oxides of indium, oxides of tin, oxides of tantalum, and oxides of antimony.

24. The light emitting structure claim 17 wherein the substrate is a III-nitride material and the first quantity of material is selected from the group consisting of zinc sulfide, III-nitride materials, SiC, ZnSe, oxides of titanium, oxides of zirconium, oxides of manganese, oxides of chromium, oxides of niobium, oxides of indium, oxides of tin, oxides of tantalum, and oxides of antimony.

* * * * *